(12) United States Patent
Holmberg et al.

(10) Patent No.: US 6,498,292 B2
(45) Date of Patent: Dec. 24, 2002

(54) CONDUCTIVE COATING ARRANGEMENT

(75) Inventors: Per Holmberg, Dalby (SE); Lars Eriksson, Emmaboda (SE); Göran Engblom, Kristianstad (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/796,580

(22) Filed: Feb. 27, 2001

(65) Prior Publication Data

US 2001/0042633 A1 Nov. 22, 2001

(30) Foreign Application Priority Data

Mar. 3, 2000  (SE) ................................. 0000711
Mar. 20, 2000 (SE) ................................ 0000907

(51) Int. Cl.⁷ ................................................ H05K 9/00
(52) U.S. Cl. ............................. 174/35 GC; 174/35 R; 361/816; 361/818
(58) Field of Search ................ 174/35 GC, 35 R, 174/35 MS; 361/753, 799, 800, 816, 818; 277/920

(56) References Cited

U.S. PATENT DOCUMENTS

| | | | | |
|---|---|---|---|---|
| 4,594,472 A | | 6/1986 | Brettle et al. .......... 174/35 GC |
| 5,352,565 A | | 10/1994 | Schroeder .................. 430/320 |
| 5,565,656 A | * | 10/1996 | Mottahed ................ 174/35 GC |
| 5,825,634 A | | 10/1998 | Moorehead, Jr. ........... 361/816 |
| 5,847,938 A | * | 12/1998 | Gammon ................ 174/35 GC |
| 6,096,413 A | * | 8/2000 | Kalinoski et al. ....... 174/35 GC |
| 6,239,359 B1 | * | 5/2001 | Lilienthal et al. ...... 174/35 GC |
| 6,242,690 B1 | * | 6/2001 | Glover ................... 174/35 GC |
| 6,323,418 B1 | * | 11/2001 | Tiburtius et al. ........ 174/35 GC |

FOREIGN PATENT DOCUMENTS

| | | |
|---|---|---|
| EP | 0 610 730 A1 | 1/1994 |
| WO | WO 99/49712 | 3/1999 |

OTHER PUBLICATIONS

Braunovic, M. "Evaluation of Different Platings for Aluminum-to-Copper Connections" 04/02.
International Type-Search Report completed by the ISA/SE on Dec. 21, 2000, in connection with priority application SE 0000711-2 as filed Mar. 3, 2000.

* cited by examiner

Primary Examiner—Dean A. Reichard
Assistant Examiner—Carmelo Oliva
(74) Attorney, Agent, or Firm—Jenkens & Gilchrist, P.C.

(57) ABSTRACT

The present invention concerns a reinforced conductive layer (7). The layer is applied at a part (3a,b) of an electrical unit, e.g. a mobile telephone, which is to come into contact with another part (3a,b). The layer (7) will protect the covered material against corrosion due to formation of a galvanic element. In a preferred embodiment of the invention the layer (7) is made of the made material as the part (3a,b) which it will come into contact with. Furthermore, spaces (16) may be formed in assembly of a mobile telephone, which spaces (16) are surrounded by conductive material. (FIG. 1)

17 Claims, 2 Drawing Sheets

CONDUCTIVE COATING ARRANGEMENT

TECHNICAL FIELD OF THE INVENTION

The present invention concerns a reinforced conductive layer, which is applied at a part of an electronic or electrical unit, e.g. a telephone, which is to come into contact with another part. The layer is mechanical, chemical and/or electrochemical resistant, The layer will protect the covered material against corrosion due to formation of a galvanic element.

DESCRIPTION OF THE PRIOR ART

In order to shield an electronic unit, preferably a telephone, against electromagnetic radiation such as ESD currents, it is at least partly surrounded by a conductive shield. This shield consists of a conductive material such as magnesium, aluminium, zinc or any other metal. It can also consist of a non-conductive material such as plastic, which is furnished with a conductive material, e.g. a conductive layer, which is able to conduct an electric current. The shield of the electronic unit will then be conductive to a desired extent.

In these contexts and for other reasons it is normal that different kinds of metals will come into contact with each other. This will lead to the creation of a galvanic element under influence of moisture or other fluids, whereby corrosion will result on at least one of the conductive materials. This will normally occur on the least noble metal. The different metals will come into contact when at least two parts of the electronic unit come into contact with each other. These parts may be placed at different parts of the electronic unit, e.g. at snaps, grooves, hooks, flanges, slots, screw joints, printed circuit carts or connectors.

For mobile telephones, one part of the shield forms the rear of the mobile telephone, which part is made of e.g. magnesium. Another part of the shield forms the front of the mobile telephone, which part may be of plastic, coated on the inside with a conductive layer mainly of silver, aluminium or the like. This layer may be coated by means of vacuum evaporating, spraying, painting, attaching a foil or may be a separately inserted conductive layer.

When the different materials come into contact with each other, a conductive unit will be formed as the shield parts are connected electrically. If this takes place in a damp environment, a galvanic element is formed. This will cause corrosion of the least noble metal, which will be decomposed and pulverised. This means that the contact between the two shield parts deteriorates, impairing or breaking the desired electrical connection between the shield parts. Furthermore, damage is created in the material. This damage is unaesthetic and also forms openings that will make the telephone loose, and lets in foreign particles such as sand, dirt, moisture and gases, which all harm the function of the telephone.

Sometimes a packing is placed between the shield parts to enhance the tightness and the contact ability between these parts. The packing is conductive and may be of steel or another metal or may be of a conductive, rubber like material. Hereby further materials that may form a galvanic element are introduced. Furthermore, there are a number of contact points where, as stated above, different metals come into contact with each other which leads to the above stated problems.

SUMMARY OF THE INVENTION

One object of the present invention is to reduce or eliminate the drawbacks of the above constructions. This is done by furnishing at least one of the parts that are to come into contact with each other with a protective conductive layer. The layer mechanically and electrically hinders/counteracts corrosion due to the formation of galvanic elements. The corrosion described above may of course arise anywhere in the electronic unit where two different metals come into contact with each other and where moisture is present and give rise to the above stated damages.

A reinforced conductive layer is provided, which layer is placed above one of the conductive materials which otherwise would have been susceptible to corrosion. The layer may be applied by tampon printing, screen printing, vacuum evaporation, painting, spraying or foiling. The layer may be applied in more than one layer. This protective layer can be made of any conductive metal. Most important is that the material has a mechanical and chemical resistance and that it will hinder moisture from reaching the underlying layer, which is to be protected, excluding any corrosion.

A preferred embodiment of the invention is provided if the protective layer is made of the same conductive material as the material it will come into contact with. In this way no galvanic element will be formed. Moisture or other chemical materials cannot go in under the reinforced conductive layer, and thus no corrosion will be formed. Accordingly the invention stops the harmful influences.

At e.g. the edges of a shield part of a mobile telephone, consisting of magnesium, the connecting parts are furnished with a conductive layer of a colour including silver, which layer is applied by e.g. tampon printing. The other shield part of the mobile telephone is made of a plastic, the inside of which is furnished with a conductive paint layer through tampon printing and which layer mainly consists of silver. As the magnesium will not come in direct contact with the silver, silver will meet silver and no galvanic element will be formed, The magnesium is protected by the silver paint, forming a reinforced conductive layer and moisture will not reach the magnesium.

The reinforced layer should be mechanically resistant and have an adhesiveness which is enough to guarantee that no holes will form in the layer and that the layer will not come off due to mechanical wear. Furthermore, the layer may be furnished with coarse metallic grains, in order to have better electrical contact between the connecting parts. The layer has a structure in which the metal grains are protected from mechanical influence and corrosion of a binder, preferably a plastic, e.g. acrylic, PVC, or a resin, whereby the metal grains will not be decomposed in any large extent. The thickness of the layer is normally 4 to 20 micrometers.

If a metal packing is placed between the shield parts, the reinforced conductive layer will still function, as the metal of the packing and the magnesium material will not come into contact with each other.

DESCRIPTION OF THE DRAWINGS

The invention will be described more closely below by way of examples with reference to the accompanying drawings, of which.

DETAILED DESCRIPTION OF THE INVENTION

Figure 1:
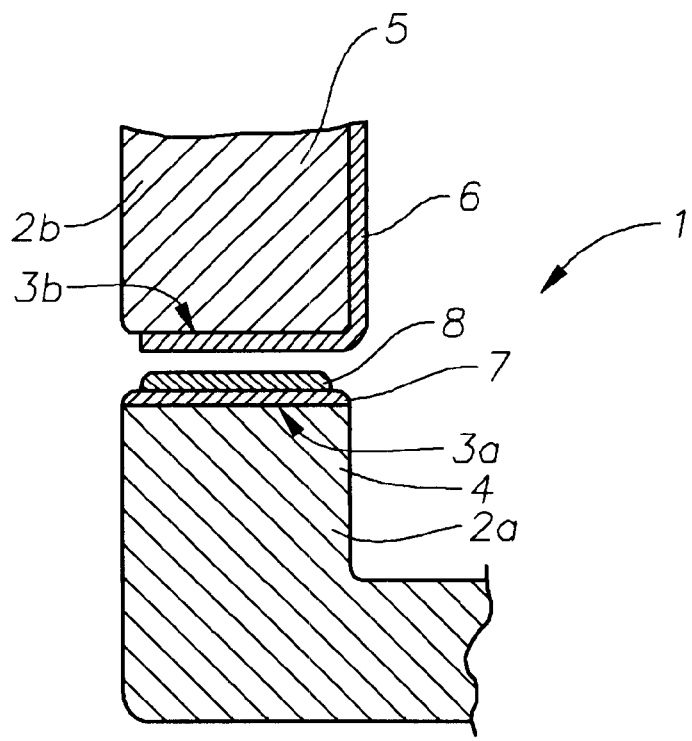
FIG. 1 shows a section through a detail of two shield parts of a mobile telephone according to the present invention
Figure 2:
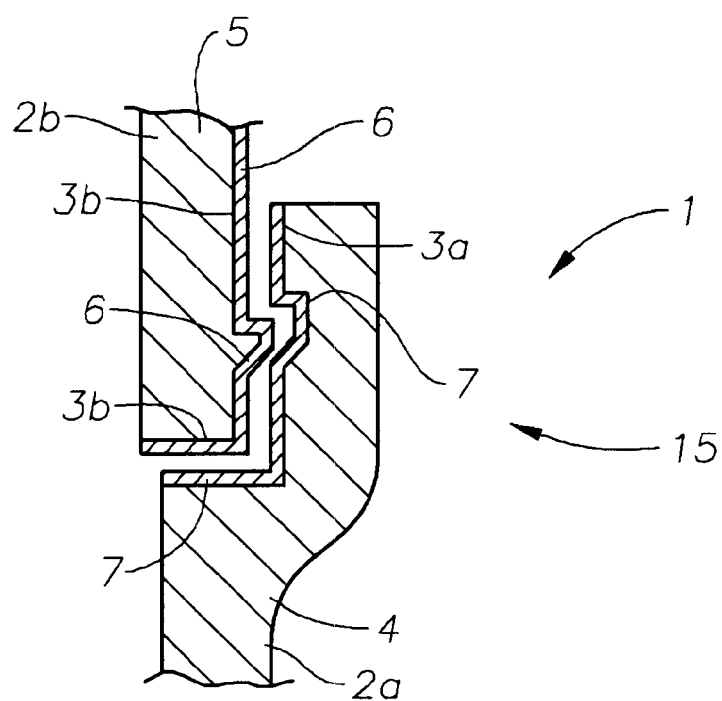
FIG. 2 shows a section through a detail of the two shield parts of a mobile telephone according to the present invention and which are connected as a snap lock.
Figure 3:
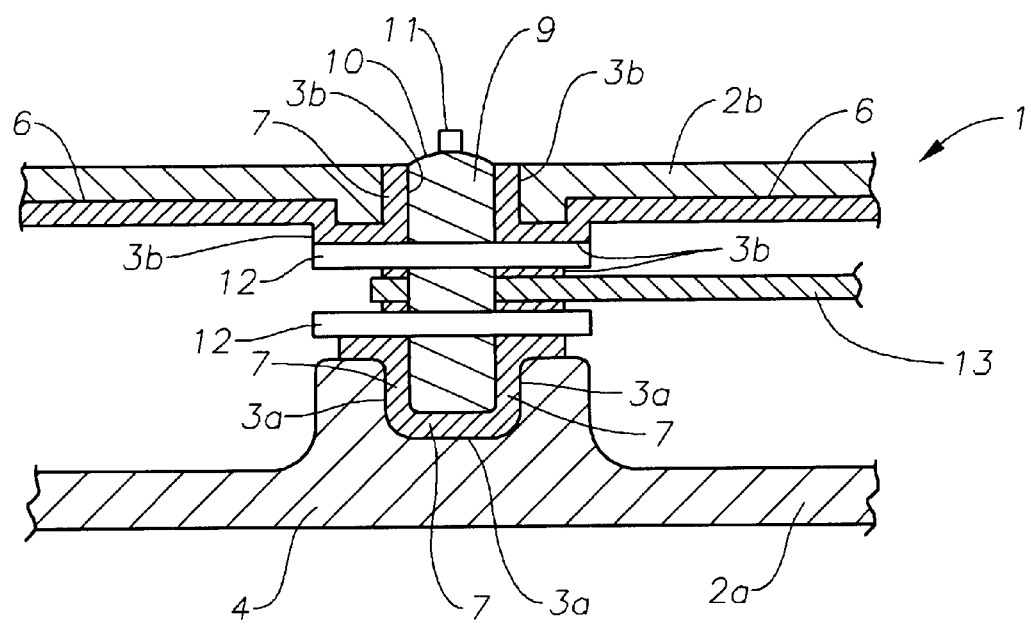
FIG. 3 shows a section through a detail of a mobile telephone, where two connectors meet at a printed circuit card, a screw joint, pogo pin or other fastener.

As is obvious from the embodiments shown in FIGS. 1, 2 and 3, a detail of an electronic unit is shown, preferably a mobile telephone 1, comprising at least two shield parts 2a,b, which are to be joined. The shield parts 2a,b have edges 14 showing connecting parts 3a,b which will come into contact when the shield parts 2a,b are united, creating an electric contact. One shield part 2a forms a back 4 of the mobile telephone 1 and is made of a metallic material, e.g. magnesium, zinc, aluminium or any other metal. The other shield part 2b of the mobile telephone 1 forms a front 5 of the telephone and is made of a plastic that is covered on the inside with a conductive layer 6. The conductive layer 6 covers the connecting part 3b of the front 5, which connecting part 3b is made of a different metal compared to the connecting part 3a of the back 4. The connecting part 3a of the back 4 is covered with a reinforced conductive layer 7, which protects the connecting part 3a of the back 4 against corrosion and mechanical influence. In order to improve the electric contact and/or the sealing effect between the joined shield parts 2a,b, an intermediate packing 8 may be provided prior to assembly. This packing 8 is made of a conductive material.

Further as shown in the embodiment of FIG. 2 the mobile telephone 1 has a variant of two connecting parts 3a,b which in an assembled state has the form of a snap lock is. The connecting parts 3a,b form the electric contact by means of the reinforced conductive layer 1. The packing 8 is not shown in this embodiment.

As shown in the embodiment of FIG. 3 the two shield parts 2a,b are connected by a screw joint 9, comprising a connector 10, which in this case is a pogo pin 11 in electrical contact with e.g. a battery and a printed circuit card 13. Different connecting parts 3a,b are present at different locations around the screw joint 9, whereby different metals meet which may form a galvanic element. Electric contact is formed with the front 5 and the back 4 by means of washers 12 at the screw joint 9 and at the printed circuit card 13. At these connecting parts 3a,b a reinforced conductive layer 7 is applied, which protects against galvanic corrosion.

Figure 4:
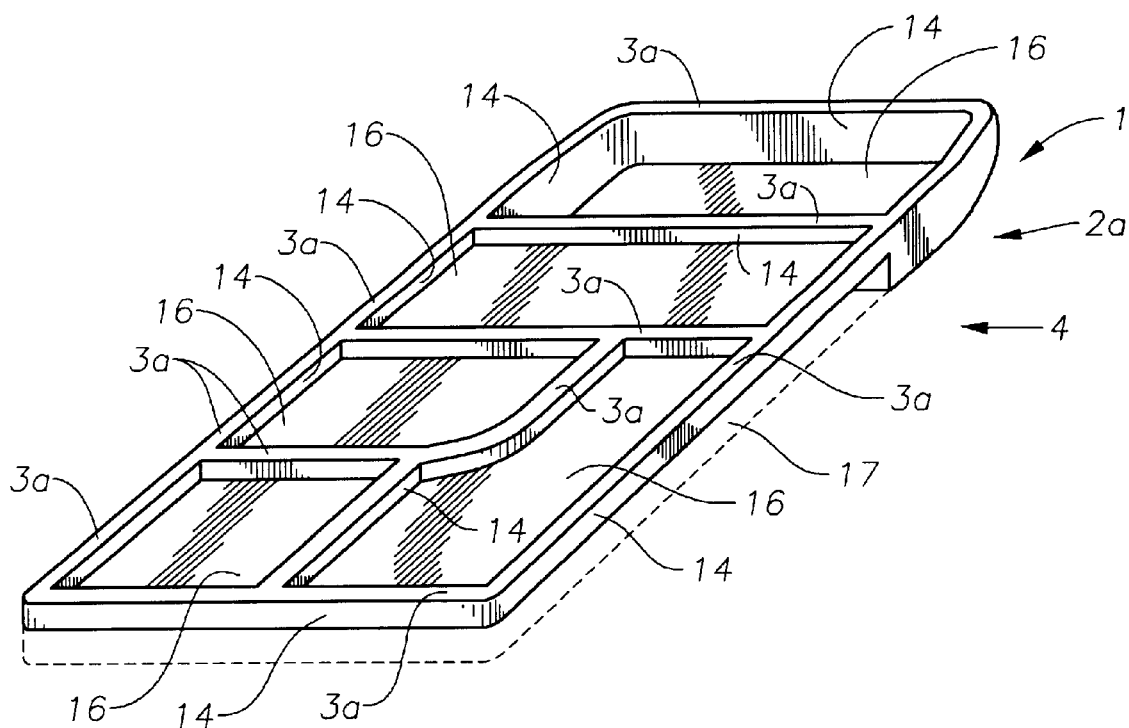
FIG. 4 shows a perspective view of a shield part of a mobile telephone, where the connectors at the edges of the shield are covered with a reinforcing conductive layer.

As shown in the embodiment according to FIG. 4, the shield part 2a, forming the back 4 of a mobile telephone 1, has edges 14 and connecting parts 3a, the connecting parts 3a extending mainly along the extent of the edges 14. When the back 4 is assembled with a front 5 (not shown), the connecting parts 3a of the back 4 will come into electric contact with the connecting parts 3b of the front 5, which connecting parts 3b have a reinforced conductive layer 7 preventing corrosion. The inside of the front 5 is covered by a conductive layer 6. The edges 14 of the back 4 and the front 5 will form spaces 16 when they are assembled. These spaces 16 are almost completely surrounded by conductive surfaces, whereby electromagnetic radiation will be limited as it mainly is enclosed in each space 16 when the edges 14 of the shields 2a,b are in contact with each other. The edges 14 have normally a height of just a few millimetres, in order to have a thin back 4 of the mobile telephone 1. A battery 17 (indicated with dashed lines) is attached to this back.

Even though the invention is described in connection with a mobile telephone, a person skilled in the art will realise that the invention is applicable for all kinds of equipment in which different conductive materials come into contact with each other.

What is claimed is:

1. An electrical unit comprising:

at least one electrically conductive material on a first part;

a second electrically con-ductive material on a second part;

wherein the first part and the second part are adapted to be connected with each other and form a shielding cover; and wherein at least one of the first part and the second part has a reinforced electrically conductive layer adapted to prevent moisture from reaching the at least one of the first part and the second part.

2. The unit of claim 1, wherein the unit is a mobile telephone comprising two shield parts, the two shield parts having edges.

3. The unit of claim 2, wherein at least one of the first part and the second part is placed on a shield part of the two shield parts or is a shield part of the two shield parts.

4. The unit of any one of the previous claims, wherein the first part and the second part are placed at a printed circuit board.

5. The unit of any of claims 2–3, wherein the edges of at least one of the two shield parts have parts to be connected with other parts, the other parts being mainly covered by the reinforced electrically conductive layer.

6. The unit of any one of claims 2–3, wherein spaces are formed between the two shield parts, which spaces are totally surrounded by conductive material.

7. The unit of any of claims 1–3, wherein the reinforced electrically conductive layer comprises at least one of a conductive foil, a conductive paint, a vacuum evaporated surface, and a separately placed reinforced conductive layer.

8. The unit of any of claims 1–3, comprising a conductive packing between the first part and the second part, at least one of the first part and the second part being covered by the reinforced electrically conductive layer.

9. The unit of any of claims 1–3, wherein the reinforced electrically conductive layer comprises at least two layers.

10. The unit of any of claims 1–3, wherein the reinforced electrically conductive layer has a thickness of 4 to 20 micrometers.

11. The unit of any of claims 1–3, wherein the reinforced electrically conductive layer is made of the same material as and comes into contact with one of the first part and the second part.

12. The unit of any of claims 1–3, wherein the reinforced electrically conductive layer comprises coarse metal particles in a binder and the binder is selected from the group consisting of acrylic, PVC, and resin.

13. The unit of any one of claims 2–3, wherein the first pat and the second part are located at a conductive layer.

14. The unit of any one of claims 2–3, wherein the first part and the second part are located at a screw joint.

15. The unit of any one of claims 2–3, wherein the first part and the second part are located at a connector.

16. The unit of any one of claims 2–3, wherein the first part and the second part are located at a pogo pin.

17. The unit of any one of claims 2–3, wherein the first part and the second part are located at a snap lock.

* * * * *